(12) United States Patent
Huang et al.

(10) Patent No.: US 11,699,674 B2
(45) Date of Patent: Jul. 11, 2023

(54) SEMICONDUCTOR PACKAGE AND METHOD OF FORMING THE SAME

(71) Applicant: Taiwan Semiconductor Manufacturing Co., Ltd., Hsinchu (TW)

(72) Inventors: Kuan-Yu Huang, Taipei (TW); Li-Chung Kuo, Taipei (TW); Sung-Hui Huang, Dongshan Township (TW); Shang-Yun Hou, Jubei (TW); Tsung-Yu Chen, Hsinchu (TW); Chien-Yuan Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 15 days.

(21) Appl. No.: 17/409,007

(22) Filed: Aug. 23, 2021

(65) Prior Publication Data

US 2021/0384154 A1 Dec. 9, 2021

Related U.S. Application Data

(62) Division of application No. 16/445,963, filed on Jun. 19, 2019, now Pat. No. 11,101,236.

(Continued)

(51) Int. Cl.
*H01L 23/00* (2006.01)
*H01L 25/065* (2023.01)
(Continued)

(52) U.S. Cl.
CPC ............. *H01L 24/27* (2013.01); *H01L 23/32* (2013.01); *H01L 24/94* (2013.01); *H01L 24/95* (2013.01);
(Continued)

(58) Field of Classification Search
CPC ......... H01L 24/27; H01L 23/32; H01L 24/94; H01L 24/95; H01L 25/0657;
(Continued)

(56) References Cited

U.S. PATENT DOCUMENTS 5,959,353 A 9/1999 Tomita
6,744,132 B2 * 6/2004 Alcoe ..................... H01L 23/10
257/710

(Continued)

FOREIGN PATENT DOCUMENTS

CN 1959966 A 5/2007
CN 101047724 A 10/2007

(Continued)

*Primary Examiner* — Jonathan Han
(74) *Attorney, Agent, or Firm* — Slater Matsil, LLP (57) ABSTRACT

A method of forming a semiconductor device includes applying an adhesive material in a first region of an upper surface of a substrate, where applying the adhesive material includes: applying a first adhesive material at first locations of the first region; and applying a second adhesive material at second locations of the first region, the second adhesive material having a different material composition from the first adhesive material. The method further includes attaching a ring to the upper surface of the substrate using the adhesive material applied on the upper surface of the substrate, where the adhesive material is between the ring and the substrate after the ring is attached.

20 Claims, 8 Drawing Sheets

Related U.S. Application Data (60) Provisional application No. 62/725,749, filed on Aug. 31, 2018.

(51) Int. Cl.
*H01L 23/32* (2006.01)
*H01L 21/60* (2006.01)

(52) U.S. Cl.
CPC .................. *H01L 25/0657* (2013.01); *H01L 2021/60097* (2013.01)

(58) Field of Classification Search
CPC ....... H01L 2021/60097; H01L 25/0655; H01L 25/18; H01L 24/13; H01L 24/16; H01L 24/29; H01L 24/73; H01L 24/81; H01L 25/16; H01L 2224/13101; H01L 24/32; H01L 23/36; H01L 23/3737; H01L 23/42; H01L 2224/16225; H01L 2224/2929; H01L 2224/29388; H01L 2924/171; H01L 23/49827; H01L 2224/16227; H01L 2224/16235; H01L 2224/29386; H01L 2224/32225; H01L 2224/73204; H01L 2224/73253; H01L 2224/81815; H01L 2924/15311; H01L 2924/181; H01L 2924/18161; H01L 23/3121; H01L 21/561; H01L 23/24; H01L 23/3142; H01L 25/071; H01L 21/56; H01L 24/28; H01L 24/75; H01L 24/83; H01L 25/074

See application file for complete search history.

(56) References Cited

U.S. PATENT DOCUMENTS

| | | | |
|---|---|---|---|
| 7,429,502 | B2 | 9/2008 | Archer, III et al. |
| 7,999,374 | B2* | 8/2011 | So ...................... H01L 23/3675 257/667 |
| 9,287,194 | B2* | 3/2016 | Hung ...................... H01L 23/16 |
| 9,887,144 | B2* | 2/2018 | Lin .......................... H01L 23/36 |
| 2006/0091542 | A1 | 5/2006 | Zhao et al. |
| 2008/0036077 | A1 | 12/2008 | Wang |
| 2014/0252634 | A1 | 9/2014 | Hung |
| 2016/0351463 | A1 | 12/2016 | Chen et al. |
| 2018/0151534 | A1 | 5/2018 | Kuroyanagi |

FOREIGN PATENT DOCUMENTS

| | | |
|---|---|---|
| TW | 200725856 A | 7/2007 |
| TW | 200810050 A | 2/2008 |
| TW | 201642412 A | 12/2016 |

* cited by examiner

SEMICONDUCTOR PACKAGE AND METHOD OF FORMING THE SAME

PRIORITY CLAIM AND CROSS-REFERENCE

This application is a divisional of U.S. patent application Ser. No. 16/445,963, filed Jun. 19, 2019, entitled "Semiconductor Package and Method of Forming the Same," which claims priority to U.S. Provisional Patent Application No. 62/725,749, filed Aug. 31, 2018, entitled "Semiconductor Device and Method of Forming the Same," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. Another example is a Chip-On-Wafer-On-Substrate (CoWoS) structure. In some embodiments, to form a CoWoS structure, a plurality of semiconductor chips are attached to a wafer, and a dicing process is performed next to separate the wafer into a plurality of interposers, where each of the interposers has one or more semiconductor chips attached thereto. The interposer with semiconductor chips(s) attached is referred to as a Chip-On-Wafer (CoW) structure. The CoW structure is then attached to a substrate (e.g., a printed circuit board) to form a CoWoS structure. These and other advanced packaging technologies enable production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Throughout the description, unless otherwise specified, like reference numerals in different figures refer to the same or similar component formed by a same or similar method using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
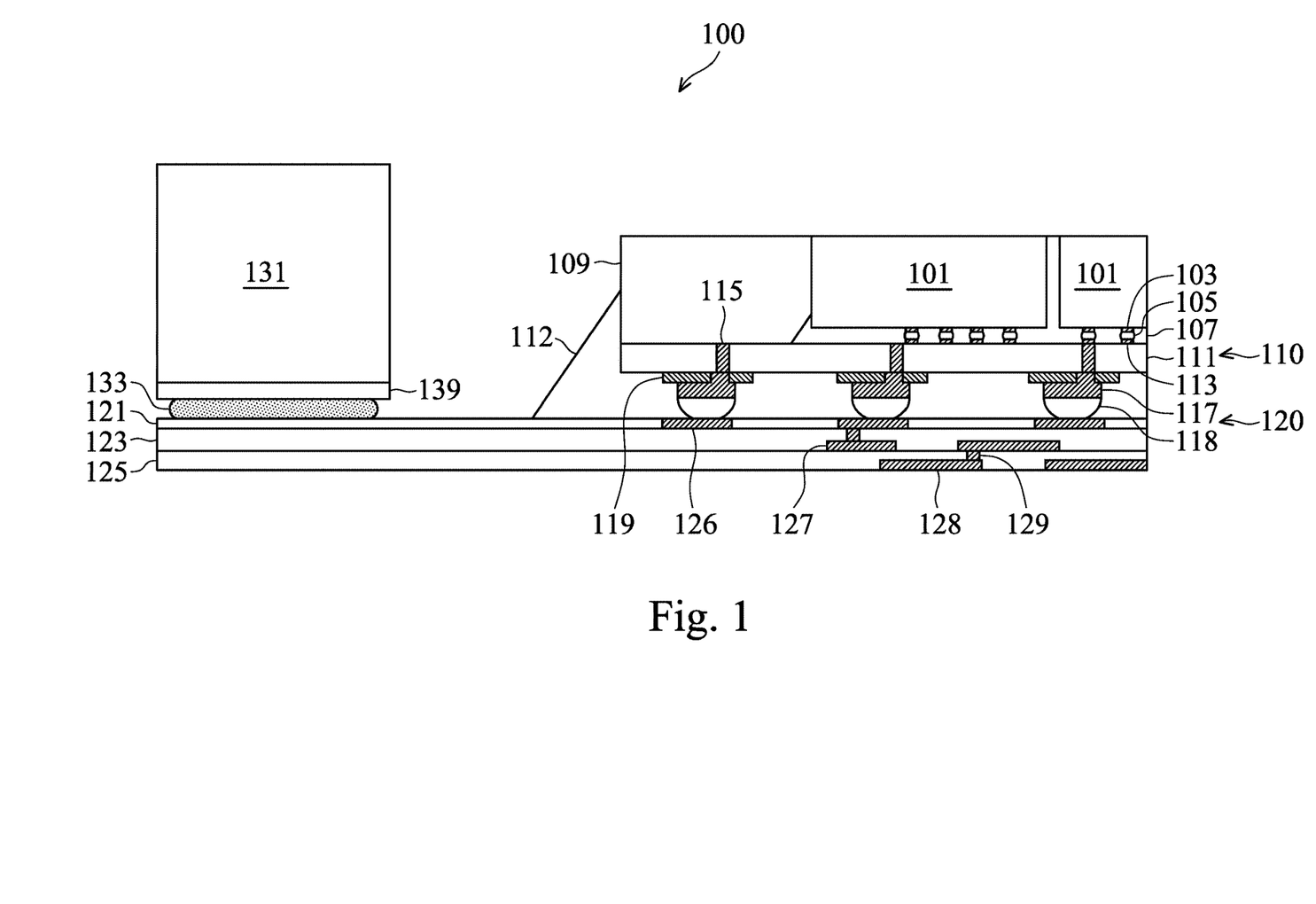
FIG. 1 illustrates a cross-sectional view of a semiconductor device, in accordance with some embodiments.

FIG. 1 illustrates a cross-sectional view of a portion of a semiconductor device 100, in accordance with some embodiments. The semiconductor device 100 is a CoWoS device, with a ring 131 attached to an upper surface of a substrate of the CoWoS device, details of which are discussed hereinafter. For simplicity, FIG. 1 only shows a left portion of the semiconductor device 100, and the right portion of the semiconductor device 100 may be the same as (e.g., symmetric to) or similar to the left portion shown in FIG. 1, as one skilled in the art will readily appreciate. Top views for various embodiments of the semiconductor device 100 are illustrated in FIGS. 2, 3, 4A, and 5.

To form the semiconductor device 100, one or more dies 101 (may also be referred to as semiconductor dies, chips, or integrated circuit (IC) dies) are attached to an interposer 110 to form a chip-on-wafer (CoW) structure, and the CoW structure is then attached to a substrate 120 (e.g., a printed circuit board) to form a chip-on-wafer-on-substrate (CoWoS) structure. The dies 101 are a same type of dies (e.g., memory dies, or logic dies), in some embodiments. In other embodiments, the dies 101 are of different types, e.g., some dies 101 are logic dies and others dies 101 are memory dies. A ring 131, which may be a rectangular shaped ring, is attached to the substrate 120 around the CoW structure using an adhesive material 133. The adhesive material 133 may include different types of adhesive materials (see, e.g., adhesive material 133A and adhesive material 133B in FIGS. 2, 3, and 4A) disposed at different locations under the ring 131. In an embodiment, the adhesive material 133A and the adhesive material 133B both remain in the final product of the semiconductor device 100. In another embodiment, one of the adhesive material (e.g., 133B) is removed after the ring 131 is attached. In yet another embodiment, after the ring 131 is attached to the upper surface of the substrate 120, the lower surface of the substrate 120 is attached to a workpiece (e.g., a mother board), and thereafter, the adhesive material 133 and the ring 131 are removed from the semiconductor device 100. Details of the various embodiments are discussed hereinafter.

To form the CoW structure, one or more dies 101 are attached to the interposer 110. Each of the dies 101 includes a substrate, electrical components (e.g., transistors, resistors, capacitors, diodes, or the like) formed in/on the substrate, and an interconnect structure over the substrate connecting the electrical components to form functional circuits of the die 101. The die 101 also includes conductive pillars 103 (also referred to as die connectors) that provide electrical connection to the circuits of the die 101.

The substrate of the die 101 may be a semiconductor substrate, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The electrical components of the die 101 comprise a wide variety of active devices (e.g., transistors) and passive devices (e.g., capacitors, resistors, inductors), and the like. The electrical components of the die 101 may be formed using any suitable methods either within or on the substrate of the die 101. The interconnect structure of the die 101 comprises one or more metallization layers (e.g., copper layers) formed in one or more dielectric layers, and is used to connect the various electrical components to form functional circuitry. In an embodiment the interconnect structure is formed of alternating layers of dielectric and conductive material (e.g., copper) and may be formed through any suitable process (such as deposition, damascene, dual damascene, etc.).

One or more passivation layers (not shown) may be formed over the interconnect structure of the die 101 in order to provide a degree of protection for the underlying structures of the die 101. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized.

Conductive pads (not shown) may be formed over the passivation layer and may extend through the passivation layer to be in electrical contact with the interconnect structure of the die 101. The conductive pads may comprise aluminum, but other materials, such as copper, may alternatively be used.

Conductive pillars 103 of the die 101 are formed on the conductive pads to provide conductive regions for electrical connection to the circuits of the die 101. The conductive pillars 103 may be copper pillars, contact bumps such as microbumps, or the like, and may comprise a material such as copper, tin, silver, or other suitable material.

Looking at the interposer 110, which includes a substrate 111, through vias 115 (also referred to as through-substrate vias (TSVs)), and conductive pads 113/117 on upper/lower surfaces of the substrate 111. FIG. 1 also illustrates a passivation layer 119 (e.g., polymer layer) of the interposer 110, which covers at least portions of the conductive pads 117. In addition, the interposer 110 may include external connectors 118 (may also be referred to as conductive bumps).

The substrate 111 may be, e.g., a silicon substrate, doped or undoped, or an active layer of a silicon-on-insulator (SOI) substrate. However, the substrate 111 may alternatively be a glass substrate, a ceramic substrate, a polymer substrate, or any other substrate that may provide a suitable protection and/or interconnection functionality.

In some embodiments, the substrate 111 may include electrical components, such as resistors, capacitors, signal distribution circuitry, combinations of these, or the like. These electrical components may be active, passive, or a combination thereof. In other embodiments, the substrate 111 is free from both active and passive electrical components therein. All such combinations are fully intended to be included within the scope of this disclosure.

Through vias 115 extend from the upper surface of the substrate 111 to the lower surface of the substrate 111, and provide electrical connections between the conductive pads 113 and 117. The through vias 115 may be formed of a suitable conductive material such as copper, tungsten, aluminum, alloys, doped polysilicon, combinations thereof, and the like. A barrier layer may be formed between the through vias 115 and the substrate 111. The barrier layer may comprise a suitable material such as titanium nitride, although other materials, such as tantalum nitride, titanium, or the like, may alternatively be utilized.

The external connectors 118 are formed on the conductive pads 117, and may be any suitable type of external contacts, such as microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like.

As illustrated in FIG. 1, the conductive pillar 103 of the dies 101 are bonded to the conductive pads 113 of the interposer 110 by, e.g., solder regions 105. A reflow process may be performed to bond the dies 101 to the interposer 110.

After the dies 101 are bonded to the interposer 110, an underfill material 107 is formed between the dies 101 and the interposer 110. The underfill material 107 may, for example, comprise a liquid epoxy that is dispensed in a gap between the dies 101 and the interposer 110, e.g., using a dispensing needle or other suitable dispensing tool, and then cured to harden. As illustrated in FIG. 1, the underfill material 107 fills the gap between the die 101 and the interposer 110, and may also fill gaps between sidewalls of the dies 101. In other embodiments, the underfill material 107 is omitted.

Next, a molding material 109 is formed over the interposer 110 and around the dies 101. The molding material 109 also surrounds the underfill material 107 in embodiments where the underfill material 107 is formed. The molding material 109 may comprise an epoxy, an organic polymer, a polymer with or without a silica-based filler or glass filler added, or other materials, as examples. In some embodiments, the molding material 109 comprises a liquid molding compound (LMC) that is a gel type liquid when applied. The molding material 109 may also comprise a liquid or solid when applied. Alternatively, the molding material 109 may comprise other insulating and/or encapsulating materials. The molding material 109 is applied using a wafer level molding process in some embodiments. The molding material 109 may be molded using, for example, compressive molding, transfer molding, molded underfill (MUF), or other methods.

Next, the molding material 109 is cured using a curing process, in some embodiments. The curing process may comprise heating the molding material 109 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 109 may be cured using other methods. In some embodiments, a curing process is not included.

After the molding material 109 is formed, a planarization process, such as chemical and mechanical planarization (CMP), may be performed to remove excess portions of the molding material 109 from over the dies 101, such that the molding material 109 and the dies 101 have a coplanar upper surface. As illustrated in FIG. 1, the molding material 109 is conterminous with the substrate 111.

In the example of FIG. 1, the CoW structure includes the interposer 110, dies 101, the underfill material 107 and the molding material 109. Next, the CoW structure is bonded to the substrate 120, which may be a printed circuit board (PCB), to form a CoWoS structure.

Looking at the substrate 120, in some embodiments, the substrate 120 is a multiple-layer circuit board. For example, the substrate 120 may include one more dielectric layers 121/123/125 formed of bismaleimide triazine (BT) resin, FR-4 (a composite material composed of woven fiberglass cloth with an epoxy resin binder that is flame resistant), ceramic, glass, plastic, tape, film, or other supporting materials. The substrate 120 may include electrically conductive features (e.g., conductive lines 127 and vias 129) formed in/on the substrate 120. As illustrated in FIG. 1, the substrate 120 has conductive pads 126 formed on an upper surface of the substrate 120, and conductive pads 128 formed on a lower surface of the substrate 120, which conductive pads 126/128 are electrically coupled to the conductive features of the substrate 120.

The interposer 110 is bonded to the substrate 120. A reflow process may be performed to electrically and mechanically coupled the interposer 110 to the substrate 120 through, e.g., external connectors 118. Next, an underfill material 112 is formed between the interposer 110 and the substrate 120. The underfill material 112 may be the same as or similar to the underfill material 107, and may be formed by a same or similar formation method, thus details are not repeated. After the interposer 110 is bonded to the substrate 120, the CoWoS structure in FIG. 1 is formed.

As more and more dies 101 are integrated into the CoWoS structure to provide semiconductor devices with enhanced functionalities and/or more storage capacity (e.g., memory capacity), the size of the interposer 110 and the size of the substrate 120 may be increased to accommodate the dies 101. As the size of the substrate 120 increases, it is increasingly difficult to keep the substrate 120 flat (e.g., having planar upper surface and/or planar lower surface). Warpage of the substrate 120 may make it difficult to bond the semiconductor device 100 to another work piece (e.g., a mother board under the substrate 120, not shown), since the conductive pads 128 at the lower surface of the substrate 120 are not disposed in a same plane due to warpage of the substrate 120. Issues, such as cold joints, may occur if a warped substrate 120 is attached to a mother board. Similarly, it may be difficult to bond the CoW structure to the substrate 120, if the substrate 120 is not flat.

Figure 2:
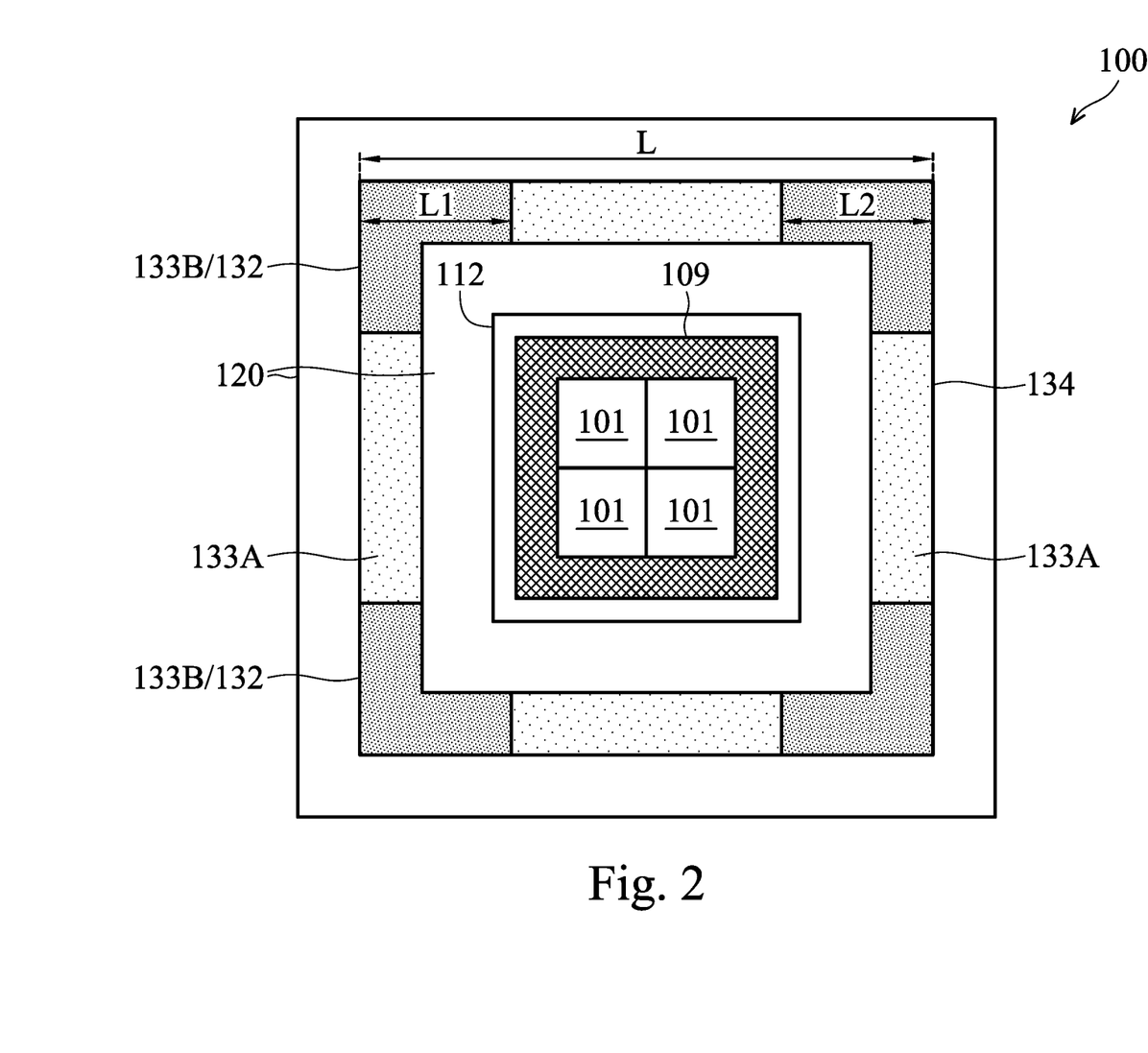
FIG. 2 illustrates a top view of the semiconductor device of FIG. 1, in accordance with an embodiment.

To control (e.g., reduce) the warpage of the substrate 120 due to its large size, a ring 131 is attached to the upper surface of the substrate 120 by an adhesive material 133, and is used to improve the planarity (e.g., flatness) of the substrate 120. In some embodiments, the ring 131 is formed of a rigid material, such as steel, copper, glass, or the like. In an embodiment, the ring 131 is formed of a bulk material (e.g., bulk steel, bulk copper, bulk glass) to provide structural support, and there is no electrical circuit inside the ring 131. In some embodiments, a UV light emitting device 139 is attached to a bottom of the ring 131, details of which are discussed hereinafter. The UV light emitting device 139 may be formed as part of the ring 131. In the illustrated embodiment, the ring 131 is a rectangular ring (e.g., having a hallow rectangle shape in a top view), and is attached to substrate 120 such that the ring 131 surrounds the CoW structure (e.g., surrounds the dies 101 and the interposer 110). The CoW structure may also have a rectangular top view, as illustrated in FIG. 2. The ring 131 is attached to the upper surface of the substrate 120 after the CoWoS structure is formed, in some embodiment. In other embodiments, the ring 131 is attached to the upper surface of the substrate 120 first, and therefore, the CoW structure comprising the dies 101 and the interposer 110 is attached to the upper surface of the substrate 120 inside the ring 131.

FIG. 2 illustrates a top view of the semiconductor device 100 of FIG. 1, after the ring 131 is attached, in accordance with an embodiment. Note that while FIG. 1 illustrates the left portion of the semiconductor device 100, FIG. 2 illustrates both the left portion and the right portion of the semiconductor device 100. To illustrate the detail of the adhesive material 133 (e.g., 133A and 133B) under the ring 131, the ring 131 is not illustrated in FIG. 2, with the understanding that the top view of the ring 131, if illustrated, would overlap with a region 134 (e.g., a hollow rectangle shaped region) illustrated in FIG. 2, where the region 134 corresponds to a region of the upper surface of the substrate 120 that is occupied (e.g., covered) by the adhesive materials 133 (e.g., 133A and 133B). In other words, the region 134 corresponds to a hollow rectangle shaped region of the surface of the substrate 120 that is under (e.g., directly under) the ring 131.

FIG. 2 illustrates the dies 101, the molding material 109 around the dies 101. The interposer 110 (see FIG. 1) is directly under the dies 101 and the molding material 109, thus not visible in the top view of FIG. 2. FIG. 2 further illustrates the underfill material 112 around the molding material 109, the adhesive material 133 disposed in the region 134, and the substrate 120. The number of the dies 101 and the location of the dies 101 illustrated in FIG. 2 are for illustration purpose and not limiting. Other numbers of dies and other locations of the dies 101 are also possible and are fully intended to be included within the scope of the present disclosure.

Different materials used in the semiconductor device 100 have different coefficients of thermal expansion (CTEs). For example, the dies 101 may have a CTE of about 2.6 ppm/° C., the substrate 120 may have a CTE of about 8.4 ppm/° C., and the ring may have a CTE of about 17.8 ppm/° C. Due to the differences in the CTEs of the different materials used in the semiconductor device 100, stress exists in the semiconductor device 100. The stress level may be especially high proximate the corners of the semiconductor device 100, such as proximate the four corners of the region 134. The stress, if left unaddressed, may cause delamination and cracks in the semiconductor device 100.

Referring to FIG. 2, in some embodiments, to alleviate the stress, multiple types of adhesive materials (e.g., adhesive materials having different material compositions), such as an adhesive material 133A and an adhesive material 133B, are used for the adhesive material 133 at different locations of the region 134. For example, the adhesive material 133B used at the corners of the region 134 is softer and/or more elastic than the adhesive material 133A used in areas of the region 134 other than the corners. FIG. 2 may be used to represent two different embodiments. In an embodiment, both the adhesive material 133A and the adhesive material 133B remain in the final product of the semiconductor device 100 after the ring 131 is attached. In another embodiment, the adhesive material 133B deposited at the corners of the region 134 is a sacrificial adhesive material, which is removed after the ring 131 is attached, and therefore, only the adhesive material 133A is left under the ring 131 in the final product of the semiconductor device 100. Details of the different embodiments described above are discussed hereinafter.

As illustrated in FIG. 2, the adhesive material 133B includes separate portions that are deposited at the four corners of the region 134. The adhesive material 133A include separate portions that are deposited in other areas of the region 134 not occupied by the adhesive material 133B. For example, a portion of the adhesive material 133A may extend continuously in the region 134 between two separate portions of the adhesive material 133B, where the two separate portions of the adhesive material 133B include a first portion of the adhesive material 133B disposed at a first corner of the region 134, and a second portion of the adhesive material 133B disposed at a second corner of the region 134 adjacent to the first corner. The adhesive materials 133A and 133B may be deposited in respective areas of the region 134 using any suitable deposition method, and thereafter, the ring 131 is placed over the adhesive material 133 and attached to the substrate 120.

After being deposited, the adhesive materials 133A/133B may be cured by a curing process. The curing process may be performed at a temperature between about 150° C. and about 300° C., and for a duration between about 1 minute and about 30 minutes. In an embodiment where the adhesive material 133B is a sacrificial adhesive material, the curing process cures the adhesive material 133A and removes the adhesive material 133B. In another embodiment, the curing process cures the adhesive materials 133A/133B, and a separate thermal process is performed subsequently to remove the adhesive material 133B (e.g., a sacrificial adhesive material).

In FIG. 2, the separate portions of the adhesive material 133B deposited at two adjacent corners of the region 134 have lengths L1 and L2, respectively, where L1 and L2 are measured along an edge of the region 134, and the edge of the region 134 has a length L. A ratio between the sum of L1 and L2 and the length L (e.g., (L1+L2)/L) may be between about 10% and about 50%, as an example, although other dimensions are also possible and are fully intended to be included within the scope of the present disclosure.

In embodiments where both the adhesive material 133A and the adhesive material 133B remain in the final product of the semiconductor device 100 (e.g., a final product for use), the adhesive material 133B is an elastic adhesive material. For example, the adhesive material 133B may be a rubber type adhesive material, a silicone type adhesive material, or the like. The rubber type adhesive material may comprise a natural rubber or synthetic rubber, such as polymers of isoprene and/or any other diene. The silicone type adhesive material may comprise, e.g., a polymer containing polysiloxane backbone (e.g., Si—O—Si). In some embodiments, the Young's modulus of the adhesive material 133B (e.g., an elastic adhesive material) is between about 0.0001 megapascal (MPa) and about 10000 Mpa, such as between about 0.001 MPa and about 10 MPa. An elongation of the adhesive material 133B is between about 10% and about 1000%, such as between about 50% and about 1000%, in some embodiments.

The adhesive material 133A is harder and/or less elastic (e.g., stiffer) than the adhesive material 133B. In some embodiments, the Young's modulus of the adhesive material 133A is between about 0.01 gigapascals (GPa) and about 5 GPa. An elongation of the adhesive material 133A is between about 20% and about 100%, as an example. Examples for the adhesive material 133A include epoxy, or the like.

The use of the elastic adhesive material (e.g., the adhesive material 133B), together with the non-homogenous structure of the adhesive material 133, help to relax the stress in the semiconductor device 100 (e.g., at the corners of the region 134), and therefore, reduces or prevents stress-induced damage (e.g., delamination, cracking) to the semiconductor device 100.

In embodiments where the adhesive material 133B is a sacrificial adhesive material, the adhesive material 133B may be or include a thermal degradable material (also referred to as a thermal-release material), such as resins or polymers with thermal degradable function group. Examples of thermal degradable material include acrylate, methacrylate, carboxylate, or the like. As another example, the adhesive material 133B (e.g., a sacrificial adhesive material) may be or include a UV degradable material (also referred to as a UV-release material) that may be removed by exposure to UV light. In subsequent processing, the adhesive material 133B is removed while the adhesive material 133A remains adhered to the ring 131 and to the substrate 120. Therefore, in the final product, only the adhesive material 133A remains between the ring 131 and the substrate 120 in the semiconductor device 100. In other words, there is an opening 132 (e.g., empty space) between the ring 131 and the substrate 120 at each location where the adhesive material 133B used to be (before it was removed). Therefore, in FIG. 2 and subsequent figures, each location of the adhesive material 133B is also labeled as an opening 132 to indicate that the opening 132 will replace the adhesive material 133B, after the removal of the adhesive material 133B. In some embodiments, the adhesive material 133B is removed after the semiconductor device 100 is bonded to another workpiece (e.g., a mother board).

In some embodiments, the Young's modulus of the adhesive material 133B (e.g., a sacrificial adhesive material) is between about 0.001 megapascals (MPa) and about 10 MPa. An elongation of the adhesive material 133B is between about 50% and about 1000%, as an example. Therefore, the adhesive material 133B (e.g., a sacrificial adhesive material) is a soft and/or elastic material. The adhesive material 133A is harder and/or less elastic (e.g., stiffer) than the adhesive material 133B. Examples for the adhesive material 133A include epoxy, or the like. In some embodiments, the Young's modulus of the adhesive material 133A is between about 0.01 gigapascal (GPa) and about 5 GPa. An elongation of the adhesive material 133A is between about 20% and about 100%, as an example.

Depending on the properties of the adhesive material 133B (e.g., a thermal degradable material, a UV degradable material), different processes may be performed to remove the adhesive material 133B. For example, the adhesive material 133B may be a thermal-release material, in which case a heating process may be performed, e.g., at a temperature between about 200° C. and about 300° C. and for a duration between about 1 minute and about 60 minutes. The heating process may cause the thermal-release material to lose it adhesiveness and to separate from the substrate 120 and the ring 131. The heating process may also cause the thermal-release material to break into small pieces. After the heating process, the loose thermal-release material may be removed from the semiconductor device 100 by, e.g., a cleaning process (using a washing fluid) or a vacuum process (to suck way the loose thermal-release material).

As another example, the adhesive material 133B may be a UV-release material, in which case a UV light may be used to remove the UV-release material. Note that if the UV-release material is used as the adhesive material 133B, the ring 131 is made of a transparent material (e.g., transparent to UV light), such as glass, so that UV light (e.g., from a UV light source external to the ring 131) can travel through the ring 131 to reach the adhesive material 133B, in an embodiment. In another embodiment, the ring 131 has a UV-light emitting device 139 (see FIG. 1) attached to, e.g., a lower surface of the ring 131 that is facing (e.g., attached to) the adhesive material 133B, in which case the ring 131 may be made of a material(s) (e.g., steel, copper) that is not transparent to the UV light. When the UV-light emitting device 139 is activated, a UV light is generated and shines on the adhesive material 133B, such that the adhesive material 133B loses its adhesiveness and is separated from the substrate 120 and the ring 131. The UV light may also cause the UV-release material to break into small pieces. After the UV process, the loose UV-release material may be removed from the semiconductor device 100 by, e.g., a cleaning process (using a washing fluid) or a vacuum process (to suck way the loose UV-release material).

Additional process may follow after the ring 131 is attached to the substrate 120. For example, the lower surface of the substrate 120 may be bonded to another work pieces, such as a mother board, such that the conductive pads 128 of the substrate 120 are mechanically and electrically coupled to conductive features of the work pieces. Details are not discussed here.

Figure 3:
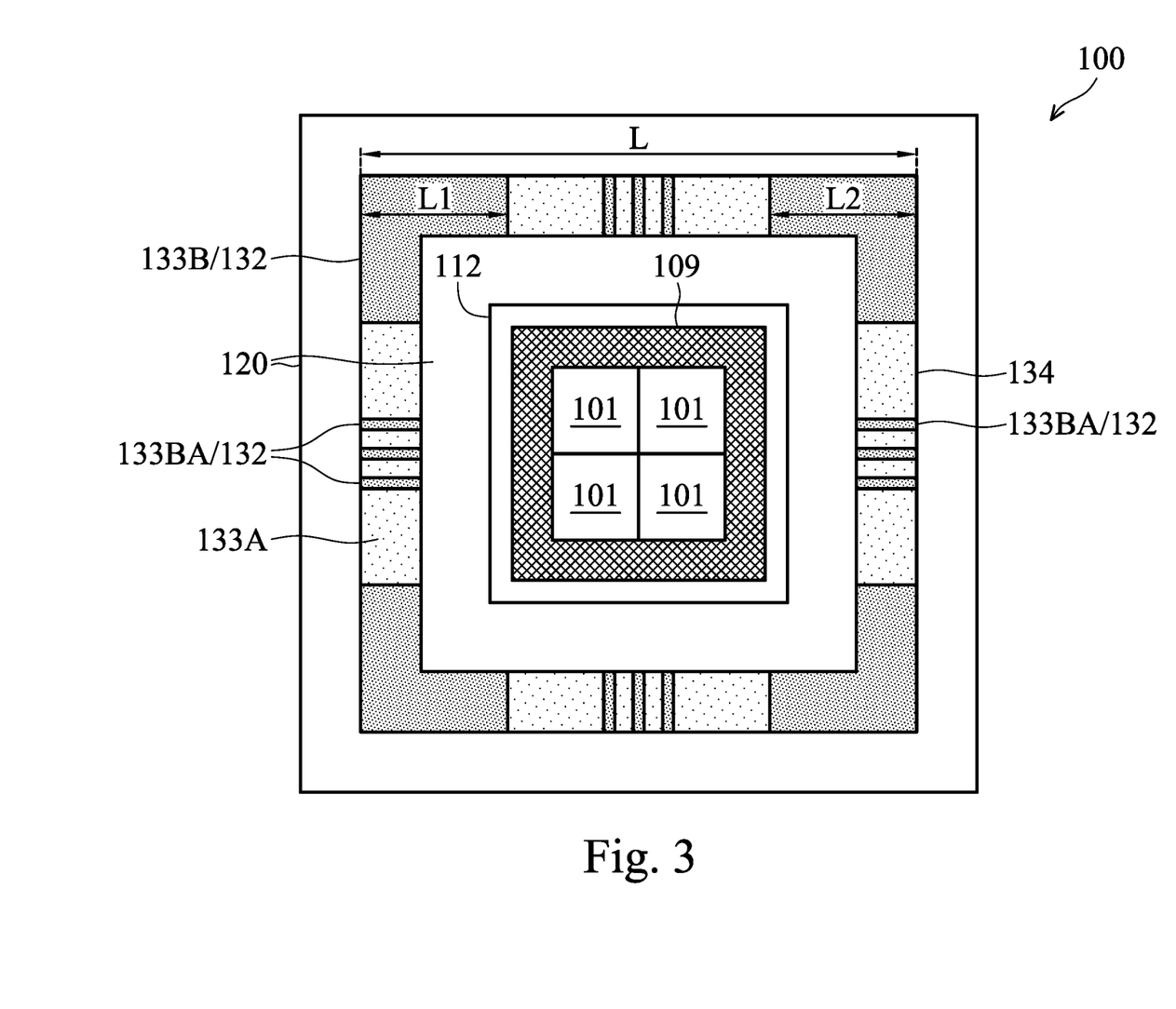
FIG. 3 illustrates a top view of the semiconductor device of FIG. 1, in accordance with an embodiment.

FIG. 3 illustrates a top view of the semiconductor device 100 of FIG. 1, in accordance with an embodiment. The embodiment in FIG. 3 is similar to that of FIG. 2, but with additional portions (labeled as 133BA) of the adhesive material 133B deposited between the adhesive material 133B disposed at the four corners of the region 134. The portions 133BA of the adhesive material 133B comprise a same material (e.g., having a same composition) as the adhesive material 133B, and include multiple strips of the adhesive material 133B embedded in (e.g., in physical contact with) the adhesive material 133A. Each of the strips extends from the upper surface of the substrate 120 to the lower surface of the ring 131. The number of strips and the locations of the strips of the adhesive material 133BA in FIG. 3 are for illustration purpose and not limiting, other number and other locations are also possible and are fully intended to be included within the scope of the present disclosure.

Referring to FIG. 3, in an embodiment, the adhesive material 133B is an elastic adhesive material, and both the adhesive material 133A and 133B remain in the final product of the semiconductor device 100. In another embodiment, the adhesive material 133B is a sacrificial adhesive material, and the adhesive material 133B is removed, e.g., by a heating process or a UV process, such that only the adhesive material 133A is left in the final product. As a result, there is an opening 132 (e.g., empty space) between the ring 131 and the substrate 120 at each location where the adhesive material 133B/133BA (a sacrificial adhesive material) used to be. Details are the same as or similar to those discussed above with reference to FIG. 2, thus are not repeated.

Figure 4A:
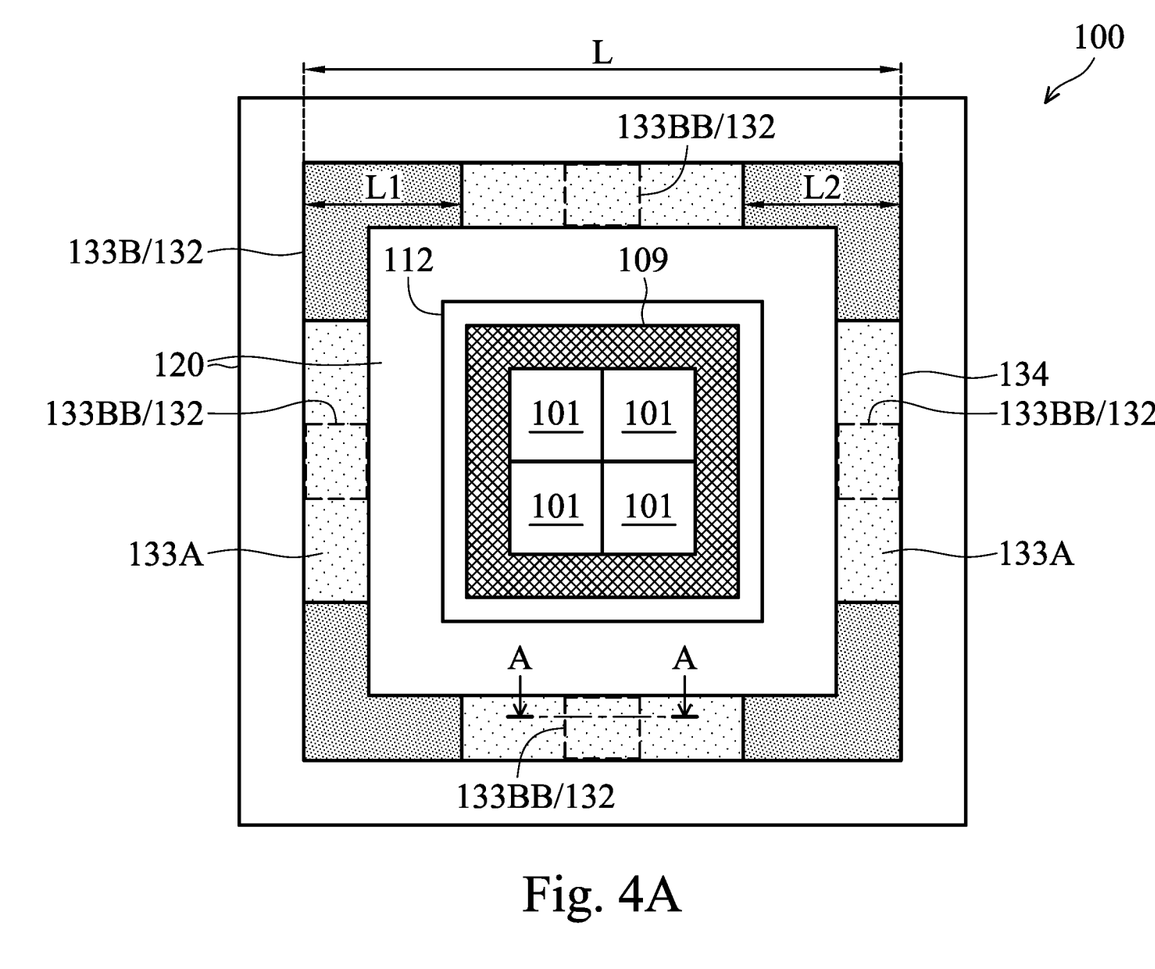
FIG. 4A illustrates a top view of the semiconductor device of FIG. 1, in accordance with an embodiment.

FIG. 4A illustrates a top view of the semiconductor device 100 of FIG. 1, in accordance with an embodiment. The embodiment in FIG. 4A is similar to that of FIG. 2, but with additional portions (see label 133BB) of the adhesive material 133B formed under the adhesive material 133A in the dashed rectangular regions of the region 134. In other words, the adhesive material 133 has a layered structure in the dashed rectangular regions, which layered structure includes a layer of the adhesive material 133B (labeled as 133BB) formed under the adhesive material 133A. Details of the layered structure of the adhesive material 133 in the dashed rectangular regions are illustrated in FIG. 4B.

Figure 4B:
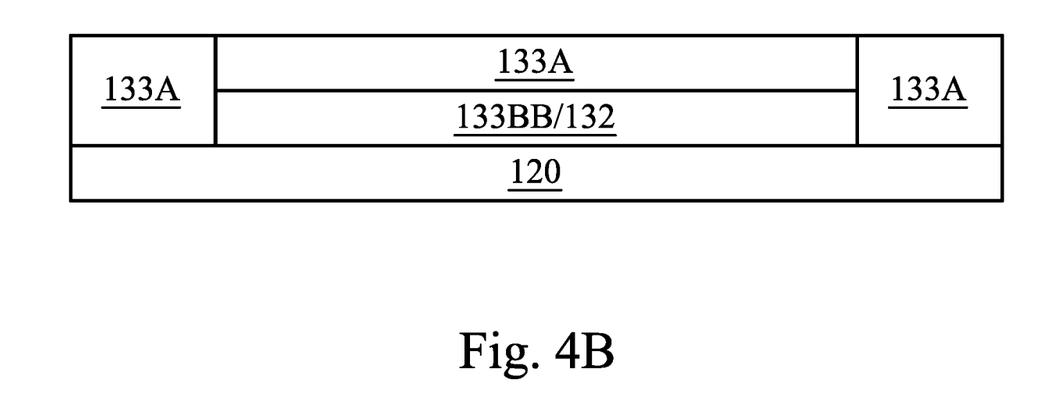
FIG. 4B illustrates a cross-sectional view of the semiconductor conductor device of FIG. 4A along cross-section A-A, in an embodiment.

FIG. 4B illustrates a cross-sectional view of a portion of the semiconductor device 100 of FIG. 4A along cross-section A-A. FIG. 4B shows the layered structure of the adhesive material 133 in the dashed rectangular regions (see FIG. 4A), which includes a layer of the adhesive material 133A over a layer of the adhesive material 133B (labeled as 133BB). FIG. 4B also illustrates the substrate 120 under the layered structure. In addition, FIG. 4B also shows portions of the adhesive material 133A adjacent to, and on both sides of, the layered structure. As illustrated in FIG. 4B, the portions of the adhesive material 133A on both sides of the layered structure have a height equal to a height of the layered structure.

Referring to FIGS. 4A and 4B, in an embodiment, the adhesive material 133B is an elastic adhesive material, and both the adhesive material 133A and 133B remain in the final product of the semiconductor device 100. In another embodiment, the adhesive material 133B is a sacrificial adhesive material and is removed, e.g., by a heating process or a UV process, such that only the adhesive material 133A is left in the final product. As a result, there is an opening 132 (e.g., empty space) between the ring 131 and the substrate 120 at each location where the adhesive material 133B/133BB used to be (before it was removed). Details are the same as or similar to those discussed above with reference to FIG. 2, thus are not repeated.

Figure 5:
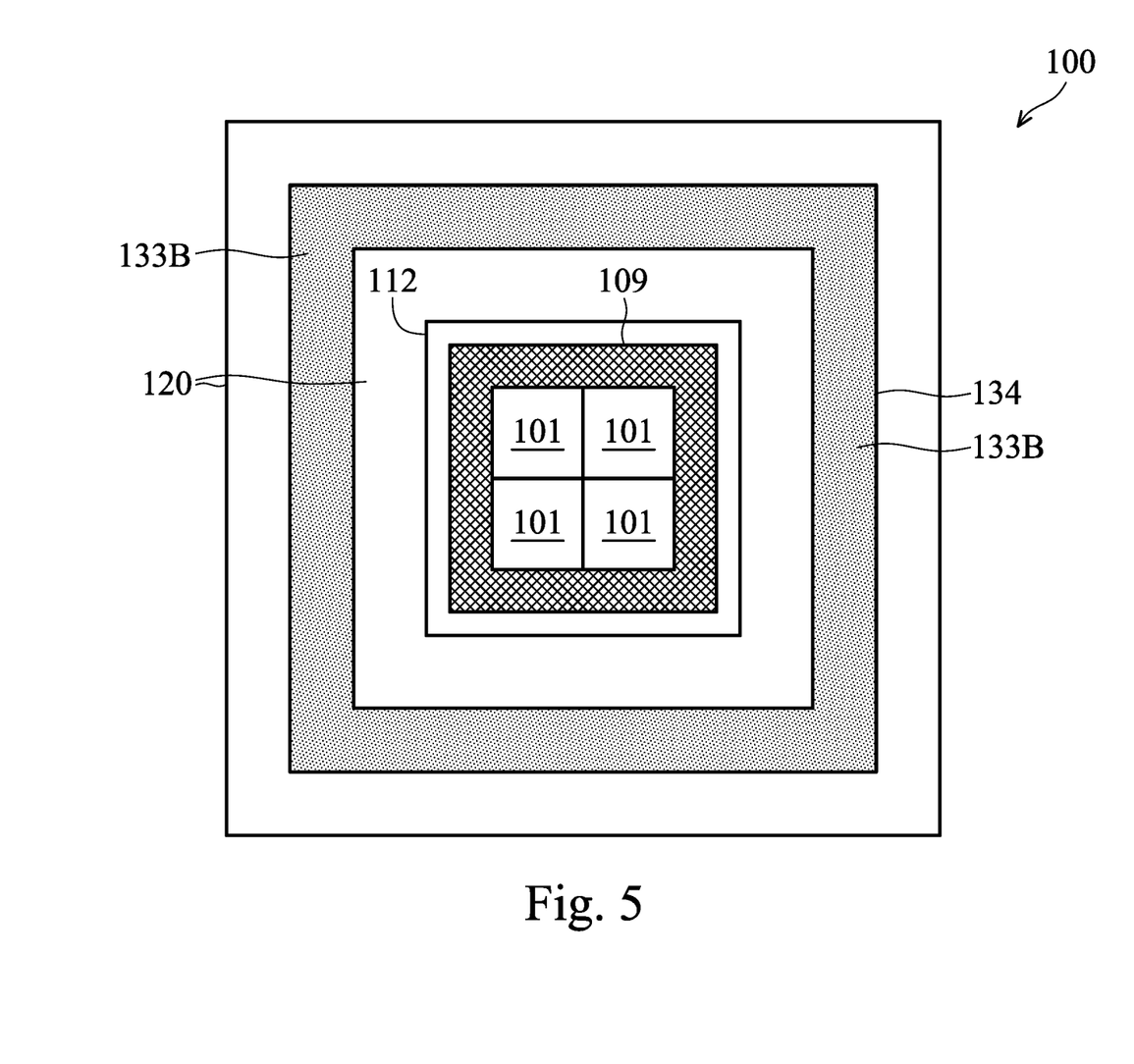
FIG. 5 illustrates a top view of the semiconductor device of FIG. 1, in accordance with an embodiment.

FIG. 5 illustrates a top view of the semiconductor device 100 of FIG. 1, in accordance with an embodiment. In the embodiment of FIG. 5, the adhesive material 133B, which is a sacrificial adhesive material, is formed continuously in the region 134 to cover the region 134. In other words, the adhesive material 133 includes only the adhesive material 133B (e.g., a sacrificial adhesive material) in this example. The sacrificial adhesive material may have a same Young's modulus and a same elongation as the sacrificial adhesive material discussed above with reference to FIG. 2. After the CoWoS structure is attached to, e.g., a mother board through conductive pads 128 at the lower surface of the substrate 120, the adhesive material 133B (e.g., a sacrificial adhesive material) is removed by, e.g., a heating process or an UV process, in an embodiment. As a result, the ring 131 is also removed from the semiconductor device 100. In other words, the ring 131 and the adhesive material 133 (e.g., 133B) are both removed from the final product of the semiconductor device 100.

Figure 6:
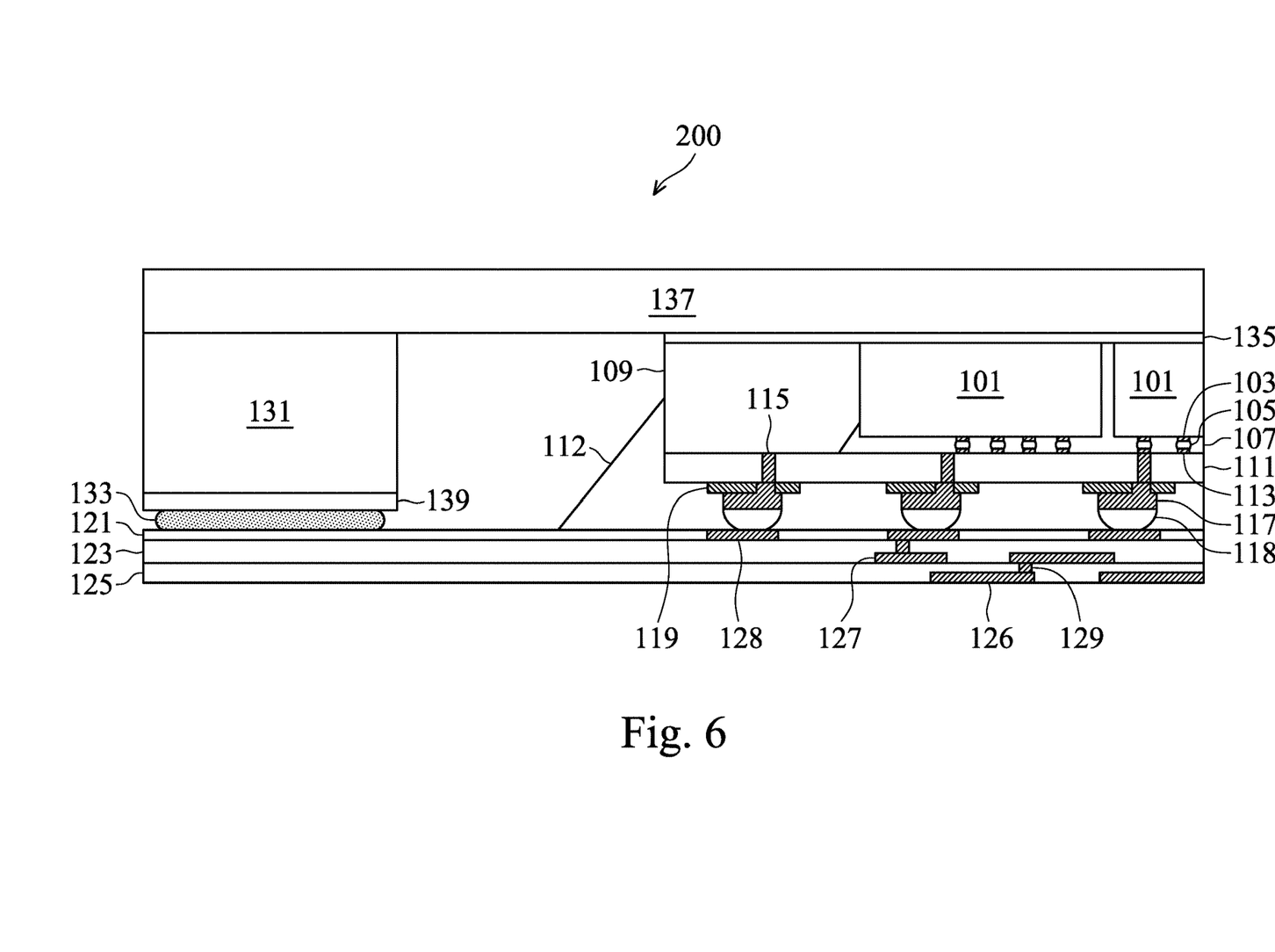
FIG. 6 illustrates a cross-sectional view of a semiconductor device, in accordance with some embodiments.

FIG. 6 illustrates a cross-sectional view of a semiconductor device 200, in accordance with some embodiments. The semiconductor device 200 is similar to the semiconductor device 100 of FIG. 1, but with a lid 137 attached to the ring 131. The lid 137 may be formed of a same material as the ring 131, in some embodiments. In other embodiments, the lid 137 is formed of a different material from the ring 131. In addition, the lid 137 is attached to the dies 101 and molding material 109 through an adhesive material 135. The adhesive material 135 may be a thermal interface material (TIM) for the purpose of heat dissipation. The TIM may include a polymer, resin, or epoxy as a base material, and a filler to improve its thermal conductivity. The filler may include a dielectric filler such as aluminum oxide, magnesium oxide, aluminum nitride, boron nitride, diamond powder, or the like. The filler may also be a metal filler such as silver, copper, aluminum, or the like.

Referring to FIG. 6, various embodiments discussed above with reference to FIGS. 2, 3, 4A and 4B may be applied to the semiconductor device 200. For example, the adhesive material 133 may include the adhesive material 133A and the adhesive material 133B, as discussed in various embodiments with reference to FIGS. 2, 3, 4A and 4B. In some embodiments, the adhesive material 133B is an elastic adhesive material, and both the adhesive material 133A and 133B remain in the final product of the semiconductor device 100. In other embodiments, the adhesive material 133B is a sacrificial adhesive material and is removed, e.g., by a heating process or a UV process, such that only the adhesive material 133A is left in the final product. Details are the same as or similar to those discussed above with reference to FIGS. 2, 3, 4A and 4B, thus are not repeated.

Still referring to FIG. 6, in an embodiment, the adhesive material 133B is a UV-release material, the ring 131 is formed of a UV transparent material such as glass for removal of the adhesive material 133B, and the lid 137 is formed of a different material than the ring 131 that is conducive to heat dissipation, such as steel or copper. In another embodiment, the ring 131 and the lid 137 are formed of a same material (e.g., copper, steel), and the ring 131 includes a UV light emitting device 139 at the bottom surface of the ring 131.

Variations to the disclosed embodiments are possible and are fully intended to be included within the scope of the present disclosure. While the adhesive material 133B deposited at different locations of the region 134 are the same material in the illustrated embodiments, these are merely non-limiting examples. More than one types of adhesive material may be deposited at locations of the region 134 occupied by the adhesive material 133B. In other words, the adhesive material 133B may be replaced by more than one types of adhesive materials. For example, in FIG. 2, the adhesive material 133B at each corner of the region 134 may be formed of a different elastic adhesive material (e.g., each elastic adhesive material having a same or similar Young's modulus and/or elongation as the adhesive material 133B), or at least two of the corners have different adhesive elastic materials formed thereon. In addition, the strips of the adhesive material 133BA in FIG. 3 may comprise two or more different elastic adhesive materials, where at least two of the strips 133BA are formed of different elastic materials. As yet another example, in FIGS. 4A and 4B, the adhesive material 133BB may be replaced by two or more layers of different elastic adhesive materials (e.g., each elastic adhesive material having a same or similar Young's modulus and/or elongation as the adhesive material 133B). These and other variations are fully intended to be included within the scope of the present disclosure.

Embodiments may achieve advantages. For example, by using a softer and/or more elastic adhesive material 133B, e.g., at corner locations under the ring 131, the stress in the semiconductor device 100 due to CTE mismatch is relaxed. As a result, damage to the semiconductor device 100, such as delamination and cracking, is avoided or reduced. The use of the ring 131 also helps to improve the planarity of the substrate 120, thus is beneficial for attaching the substrate 120 to another work piece (e.g., a mother board), or for attaching the CoW structure to the substrate 120. The improved planarity of the substrate 120 makes it easier to bond the substrate 120 to other devices, and may reduce or avoid issues such as cold joints.

Figure 7:
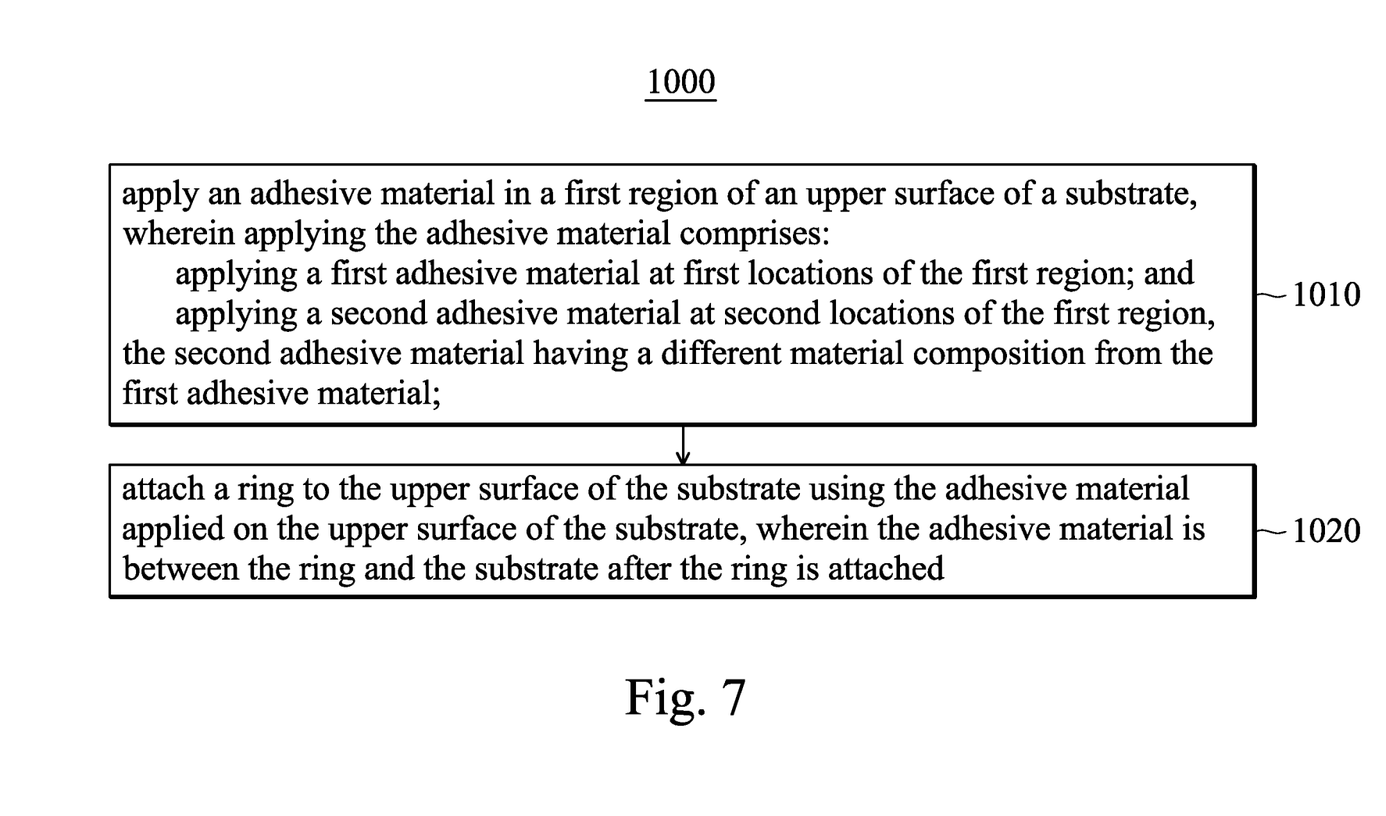
FIG. 7 illustrates a flow chart of a method of forming a semiconductor device, in some embodiments.

FIG. 7 illustrates a flow chart of a method of forming a semiconductor device, in some embodiments. It should be understood that the embodiment method shown in FIG. 7 is merely an example of many possible embodiment methods. One of ordinary skill in the art would recognize many variations, alternatives, and modifications. For example, various steps as illustrated in FIG. 7 may be added, removed, replaced, rearranged and repeated.

Referring to FIG. 7, at block 1010, an adhesive material is applied in a first region of an upper surface of a substrate, wherein applying the adhesive material comprises: applying a first adhesive material at first locations of the first region; and applying a second adhesive material at second locations of the first region, the second adhesive material having a different material composition from the first adhesive material. At block 1020, a ring is attached to the upper surface of the substrate using the adhesive material applied on the upper surface of the substrate, wherein the adhesive material is between the ring and the substrate after the ring is attached.

In accordance with an embodiment, a method of forming a semiconductor device includes applying an adhesive material in a first region of an upper surface of a substrate, wherein applying the adhesive material comprises: applying a first adhesive material at first locations of the first region; and applying a second adhesive material at second locations of the first region, the second adhesive material having a different material composition from the first adhesive material. The method further includes attaching a ring to the upper surface of the substrate using the adhesive material applied on the upper surface of the substrate, wherein the adhesive material is between the ring and the substrate after the ring is attached. In an embodiment, the first adhesive material and the second adhesive material are applied at different locations of the first region. In an embodiment, the first adhesive material comprises first separate portions disposed under corners of the ring, and the second adhesive material comprises second separate portions disposed between the first separate portions of the first adhesive material. In an embodiment, a Young's modulus of the first adhesive material is smaller than that of the second adhesive material. In an embodiment, the Young's modulus of the first adhesive material is between 0.001 MPa and 10 MPa, and wherein a Young's modulus of the second adhesive material is between 0.01 GPa and 5 GPa. In an embodiment, an elongation of the first adhesive material is larger than that of the second adhesive material. In an embodiment, the elongation of the first adhesive material is between 50% and 1000%, and an elongation of the second adhesive material is between 20% and 100%. In an embodiment, the method further includes attaching a die to a first surface of a interposer; forming a molding material on the first surface of the interposer around the die; and attaching a second surface of the interposer opposing the first surface to the upper surface of the substrate within the first region, wherein the interposer is surrounded by the ring. In an embodiment, the method further includes, after the ring is attached, removing the first adhesive material while keeping the second adhesive material between the ring and the substrate. In an embodiment, removing the first adhesive material includes performing a heating process to separate the first adhesive material from the substrate, wherein the second adhesive material remains adhered to the substrate after the heating process. In an embodiment, the ring is transparent to ultraviolet (UV) light, wherein removing the first adhesive material comprises: performing a UV process by shining a UV light on the adhesive material through the ring, wherein the first adhesive material is separated from the substrate while the second adhesive material remain adhered to the substrate after the UV process. In an embodiment, the ring comprises an ultraviolet (UV) light emitting device at a bottom surface of the ring facing the adhesive material, wherein removing the first adhesive material comprises: performing a UV process by activating the UV light emitting device to shine a UV light on the adhesive material, wherein the first adhesive material is separated from the substrate while the second adhesive material remain adhered to the substrate after the UV process.

In accordance with an embodiment, a method of forming a semiconductor device includes forming a first adhesive material at first locations of a region on an upper surface of a substrate, the first locations comprising corners of the region; forming a second adhesive material at second locations of the region different from the first locations, the second adhesive material being a different material from the first adhesive material, a Young's modulus of the first adhesive material being smaller than that of the second adhesive material; and attaching a ring to the upper surface of the substrate using the first adhesive material and the second adhesive material. In an embodiment, the method further includes attaching a lower side of an interposer to the upper surface of the substrate within the region, wherein a die is attached to an upper side of the interposer. In an embodiment, the first locations further comprise locations in the region between the corners of the region. In an embodiment, an elongation of the first adhesive material is larger than that of the second adhesive material. In an embodiment, the method further includes removing the first adhesive material after attaching the ring, wherein the second adhesive material remain adhered to the substrate and the ring after removing the first adhesive material.

In accordance with an embodiment, a semiconductor device includes a substrate; a ring attached to an upper surface of the substrate; and an adhesive material between the substrate and the ring, wherein the adhesive material comprises a first adhesive material disposed under corners of the ring and comprises a second adhesive material disposed between the first adhesive material, the first adhesive material having different composition from the second adhesive material. In an embodiment, the first adhesive material comprises first separate portions disposed under the corners of the ring, and the second adhesive material comprises second separate portions disposed between the first separate portions of the first adhesive material. In an embodiment, the first adhesive material is more elastic than the second adhesive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a ring attached to an upper surface of the substrate, wherein the ring comprises corner portions and edge portions connecting the corner portions; and
   an adhesive material between the substrate and the ring, wherein the adhesive material extends from a lower surface of the ring facing the substrate to the substrate, wherein the adhesive material comprises discrete portions disposed under the edge portions of the ring, wherein there is no adhesive material between the corner portions of the ring and the substrate.

2. The semiconductor device of claim 1, further comprising a semiconductor structure attached to the upper surface of the substrate, wherein the semiconductor structure is surrounded by the ring.

3. The semiconductor device of claim 2, wherein the semiconductor structure comprises:
   an interposer;
   a die attached to a first surface of the interposer, wherein a second surface of the interposer opposing the first surface is attached to the substrate; and
   an underfill material between the interposer and the substrate.

4. The semiconductor device of claim 3, wherein the underfill material is spaced apart from the ring.

5. The semiconductor device of claim 1, wherein the adhesive material under each of the edges portions of the ring comprises:
   a first portion extending from a lower surface of the ring facing the substrate to the upper surface of the substrate;
   a second portion extending from the lower surface of the ring to the upper surface of the substrate; and
   a third portion between the first portion and the second portion, wherein the third portion extends continuously along the lower surface of the ring from the first portion to the second portion, wherein there is an opening between the third portion and the upper surface of the substrate.

6. The semiconductor device of claim 1, wherein the ring is transparent to ultraviolet (UV) light.

7. The semiconductor device of claim 1, wherein the ring comprises an ultraviolet (UV) light emitting device at a bottom surface of the ring facing the adhesive material.

8. The semiconductor device of claim 1, wherein the adhesive material under each of the edges portions of the ring comprises a plurality of segments that are laterally spaced apart from each other.

9. The semiconductor device of claim 8, wherein there are empty spaces between the plurality of segments of the adhesive material.

10. The semiconductor device of claim 1, wherein there are empty spaces between the corner portions of the ring and the substrate.

11. A semiconductor device comprising:
    a substrate;
    a package attached to an upper surface of the substrate;
    a ring around the package and attached to the upper surface of the substrate, wherein the ring comprises corner portions and edge portions connecting the corner portions; and an adhesive material between the substrate and the ring, wherein the adhesive material comprises discrete portions disposed between the edge portions of the ring and the substrate, wherein a first plurality of openings are disposed between the corner portions of the ring and the substrate.

12. The semiconductor device of claim 11, wherein a second plurality of openings are disposed between the edge portions of the ring and the substrate, wherein the second plurality of openings are disposed laterally between the discrete portions of the adhesive material.

13. The semiconductor device of claim 12, wherein each of the first plurality of openings and the second plurality of openings exposes a lower surface of the ring facing the substrate, and exposes the upper surface of the substrate.

14. The semiconductor device of claim 11, further comprising an underfill material between the package and the substrate, wherein in a top view, the underfill material surrounds the package and is physically separated from the ring.

15. The semiconductor device of claim 11, wherein a Young's modulus of the adhesive material is between 0.01 GPa and 5 GPa.

16. The semiconductor device of claim 15, wherein an elongation of the adhesive material is between 20% and 100%.

17. The semiconductor device of claim 11, wherein there is no adhesive material between the corner portions of the ring and the substrate.

18. A semiconductor device comprising:
a substrate;
a package attached to an upper surface of the substrate;
an underfill material between the package and the substrate;
a ring around the package and attached to the upper surface of the substrate, wherein the ring comprises corner portions and edge portions connecting the corner portions, wherein the ring is spaced apart from the underfill material; and
an adhesive between the substrate and the ring, wherein the adhesive comprises:
a first adhesive material between the corner portions of the ring and the substrate; and
a second adhesive material between the edge portions of ring and the substrate, wherein the first adhesive material is different from the second adhesive material.

19. The semiconductor device of claim 18, wherein a Young's modulus of the first adhesive material is smaller than that of the second adhesive material.

20. The semiconductor device of claim 19, wherein an elongation of the first adhesive material is larger than that of the second adhesive material.

\* \* \* \* \*